US010525626B2

(12) United States Patent
Lawless, III et al.

(10) Patent No.: US 10,525,626 B2
(45) Date of Patent: Jan. 7, 2020

(54) METHOD FOR MONITORING AND CONTROLLING AN INJECTION MOLDING PROCESS USING A STRAIN GAUGE (71) Applicant: IMFLUX INC., Hamilton, OH (US)

(72) Inventors: William Francis Lawless, III, Medford, MA (US); Rick Alan Pollard, Moscow, OH (US); Brian Matthew Burns, Mason, OH (US); Gene Michael Altonen, Hamilton, OH (US)

(73) Assignee: IMFLUX INC., Hamilton, OH (US)

( * ) Notice: Subject to any disclaimer, the term of this patent is extended or adjusted under 35 U.S.C. 154(b) by 321 days.

(21) Appl. No.: 15/616,133

(22) Filed: Jun. 7, 2017

(65) Prior Publication Data

US 2018/0001530 A1 Jan. 4, 2018

Related U.S. Application Data (60) Provisional application No. 62/356,643, filed on Jun. 30, 2016.

(51) Int. Cl.
*B29C 45/76* (2006.01)
*G11C 7/00* (2006.01)

(52) U.S. Cl.
CPC ............... *B29C 45/76* (2013.01); *G11C 7/00* (2013.01)

(58) Field of Classification Search
CPC ........ B21D 22/22; B21D 22/02; B21D 22/06; B21D 22/20; B21D 17/32; B29C 44/42; B29C 44/60; B29C 45/76; B29C 45/78; B29C 45/77; B29C 45/773; B29C 45/768; B29C 45/7653; B29C 45/7626; B29C 45/84; B29C 45/842; G11C 7/00

See application file for complete search history.

(56) References Cited

U.S. PATENT DOCUMENTS 4,680,151 A * 7/1987 Fujita .................... B22D 17/32
264/40.3
2016/0236392 A1 8/2016 Aoyama

FOREIGN PATENT DOCUMENTS

| DE | 102011102313 A1 | 12/2011 |
| DE | 102012018748 A1 | 4/2013 |
| EP | 0644030 A2 | 3/1995 |
| EP | 0671575 A2 | 9/1995 |
| EP | 1205291 A1 | 5/2002 |
| WO | WO-2015/060315 A1 | 4/2015 |

OTHER PUBLICATIONS

International application No. PCT/US2017/036311, International Search Report and Written Opinion, dated Oct. 12, 2017.

* cited by examiner

*Primary Examiner* — Michael P Wieczorek
(74) *Attorney, Agent, or Firm* — Marshall, Gerstein & Borun LLP (57) ABSTRACT

Methods of monitoring and controlling a molding process using a sensed change in strain provided by a strain gauge are provided. A target strain profile is created for a molding process of a molding apparatus. An upper and lower deviation limit from the target strain profile for the molding process is provided. If a sensed change in strain exceeds a deviation limit, an alarm is activated.

28 Claims, 11 Drawing Sheets

**ALARM CAUSES DURING MOLD CLOSE
(STEPS 1-3)
600**

Improper Installation of Mold
610

Change in Clamping Tonnage Setpoint
620

Change in Mold Temperature
630

Machine is Not Level
640

Parallelism Has Changed
650

Strain Gauge Has Changed
660

METHOD FOR MONITORING AND CONTROLLING AN INJECTION MOLDING PROCESS USING A STRAIN GAUGE

CROSS-REFERENCE TO RELATED APPLICATION

This application is the non-provisional, claiming the benefit under 35 USC § 119(e) of the filing date of, U.S. Provisional Application No. 62/356,643, filed Jun. 30, 2016, which is incorporated herein by reference in its entirety.

FIELD OF THE DISCLOSURE

This application relates generally to injection molding and, more specifically, to a method of controlling an injection molding process using at least one strain gauge. In particular, this application relates to identifying the step that an injection molding process is undergoing using parameters sensed by at least one strain gauge and, optionally, a heat sensor, and ordering corrective action in the event that the sensed parameters deviate from target parameters for an identified step.

BACKGROUND

At the start of an injection molding process, thermoplastic pellets are fed by a hopper into a heated barrel and driven to the end of the heated barrel by a reciprocating screw. The thermoplastic pellets melt into a molten thermoplastic material, and shots of thermoplastic material are extruded through a nozzle. The molten thermoplastic material then flows through runners to the gate of a mold. After entering the gate, the molten thermoplastic material fills a mold cavity formed between two or more sides of the mold held together under pressure by a press or clamping unit. Once the shot of molten thermoplastic material is injected into the mold cavity, the reciprocating screw stops traveling forward. The molten thermoplastic material takes the form of the mold cavity and cools inside the mold until it solidifies. Then the clamping unit releases the mold sides and the finished part is ejected from the mold.

The injection molding process may vary depending on the type of injection molding being performed. For example, traditional injection molding machines inject the molten thermoplastic material at very high pressures, typically greater than 15,000 psi, for a first period of time, and thereafter hold the pressure for a second period of time at a lower but still relatively high pressure of 10,000 psi or more. More recently, constant low pressure multi-cavity injection molding systems have been developed that inject the molten plastic material into the mold cavity at a substantially constant low pressure, typically less than 6,000 psi, for a single time period. Other injection molding processes include metal injection molding (MIM), reaction injection molding (RIM), and liquid injection molding (LIM).

Whatever the type of injection molding process being carried out, monitoring of the process over time is desirable in order to catch and correct any problems as soon as possible. For example, the pressure within a mold cavity is an important parameter to monitor, as insufficient pressure may result in improperly formed parts while excessive pressure may result in damage to the mold. One particular motivation to monitor flow front position and/or control internal pressure at certain times during the short duration of filling of a mold cavity is to account for flow filling challenges.

The term "flow filling challenge" is defined as a region of a part of a mold that forms a feature of a part to be molded which is particularly susceptible to any one or more of a number of problems that complicate the molding of the part or render the molded part more likely to suffer from one or more defects or reduced mechanical properties, such as short-fills, warp, sinks, brittleness, flash, voids, non-fills, weakness (e.g., low tensile, torsional, and/or hoop strength), high stress concentrations, low modulus, reduced resistance to chemical exposure, premature fatigue, non-uniform shrinkage, and discontinuities in color, surface texture, opacity, translucency, or transparency. Non-exhaustive examples of flow filling challenges are: Locations in a mold used to form ribs, bosses, or corners, as well as obstacles in a mold (such as core pins), and transitions (such as a change in thickness of a part to be molded, which may be a sudden stepped change in thickness or a gradual change in thickness, such as a tapered region). These can involve a transition from a relatively thick region to a relatively thin region, and then back to a relatively thick region, and may involve one or more changes in thickness. The portion of a mold cavity used to form a living hinge, which is typically an integral, relatively thin region of a molded part that permits one portion of the part, such as a flip-top of a cap, to rotate with respect to the rest of the part, also poses a flow filling challenge. As the term flow filling challenge is used herein, it is contemplated that the region of the part affected by a particular challenge may be at a particular position of a mold cavity, along a region of a mold cavity, or downstream of a particular position or region of a mold cavity, and as such, a flow filling challenge need not be limited to a particular location of a change in shape of a mold cavity, but may extend beyond, i.e. downstream of, such a location.

Ideally, sensors for monitoring an injection molding process would be indirect, easy to install, and inexpensive. Direct sensors, such as sensors placed within a mold cavity, leave undesirable marks on part surfaces. For example, while demand for injection molded parts with high gloss finishes has been increasing, direct sensors positioned in the mold cavity have a tendency to mar the high gloss finish of the parts, requiring post-molding operations to machine or otherwise mask or remove the marred regions from the parts. As a result, indirect sensors that are not located in the mold cavity are preferable. Additionally, when the molding system is being used to make products for medical applications, contact between a sensor and the thermoplastic material may be prohibited. Some current indirect sensors include parting line sensors, ejector or static pin sensors, and ultrasonic sensors. Unfortunately, these indirect sensors cannot always be placed in optimal locations, sometimes require that a mold apparatus undergo a period of downtime in order to be machined so that the sensor can be mounted, and can be expensive.

More recently, strain gauges have been placed on a mold surface, within a nozzle adapter, or elsewhere within an injection molding apparatus, in order to measure how strain at the measured location changes over the course of a standard injection molding process. For example, a strain gauge sensor placed on the exterior of the mold surface adjacent to a parting line of a mold, as described in co-owned U.S. patent application Ser. No. 62/303,654, "External Sensor Kit for Injection Molding Apparatus and Methods of Use," the entirety of which is hereby incorporated by reference, is able to sense the surface strain changes on the mold surface that occur over time as a result of the closing and opening forces. In response to surface strain changes, the strain gauge sensor emits an electrical signal, typically in the range of −10 to 10 Volts. The signal emitted by the strain gauge sensor is received and used by a controller to approximate one or more conditions within the mold, such as the pressure within the mold cavity or the location of the melt flow front. In certain molds in which the ratio of the length of the flow channel to the thickness of the molded part is great, i.e. molds having a high length-to-thickness (L/t) ratio, the pressure at the melt flow front may be approximated based on the signals emitted by the strain gauge sensor(s).

SUMMARY

Embodiments within the scope of the present disclosure are directed to methods of monitoring and controlling an injection molding process using sensed parameters provided by an external sensor. Strain gauge sensors are the type of sensor primarily discussed, while other sensors capable of detecting movement of the nozzle as a proxy or tell-tale for internal conditions such as mold cavity pressure or flow front location, could achieve the same purpose as a strain gauge sensor and are within the scope of the present disclosure. For example, microwave sensor kits, x-ray sensor kits, ultrasonic sensor kits, air pressure sensor kits, air temperature sensor kits, and sub-surface temperature sensor kits, could all be substituted for the strain gauge sensors described and depicted below. Additionally, other types of external gauge sensors, such as electrical, electronic, mechanical, wireless, and fiber optic sensors, could be utilized instead of strain gauge sensors. Strain gauge sensors located on mold surfaces are primarily discussed below, while strain gauge sensors located within nozzle adapters or in other locations within an injection molding apparatus could achieve the same purposes.

Throughout an injection molding process, the mold experiences changes in strain. The strain experienced by a mold may differ depending on what type of injection molding process is being used. A strain profile can be developed that identifies target strain changes that should be occurring at each step in an injection molding process. For example, in a conventional injection molding process, at the start of the cycle (step 1), the mold is open and experiences no strain. Then the mold halves close and the clamping tonnage begins to build, and the mold experiences a change in strain (step 2). When the clamp tonnage set-point for securing the mold halves together is reached, the change in strain in the mold becomes zero (step 3). The mold experiences a moderate change in strain as plastic begins to enter and fill the mold (step 4) and then experiences a significant change in strain as the end of the fill approaches and molten thermoplastic material is more tightly packed into the mold (step 5). At the end of the fill, the increase in pressure resulting from the final filling of the mold cavity is balanced by the reduction in pressure resulting from the previously injected thermoplastic material beginning to cool and shrink (step 6) so little to no change in strain is experienced. After the fill is completed, the molten thermoplastic material forming the part is allowed to cool and shrink (step 7), causing a change in strain in the mold cavity. The strain in the mold is then held constant until the thermoplastic material in the gate of the mold freezes (steps 8-10). The mold is then unclamped, resulting in a change in strain (step 11). When the mold is opened to release the part, the mold will no longer experience a change in strain (step 12). The cycle is then finished (step 13).

Target strain profiles can be mapped for other molding processes, such as substantially constant pressure injection molding systems, and injection-blow molding systems. Additionally, target strain profiles can be developed metal injection molding (MIM), reaction injection molding (RIM), liquid injection molding (LIM), structural foam molding, liquid crystal polymer (LCP) molding, and stretch blow molding. In general, the strain profiles for such molding processes would look similar to those for conventional injection molding, but some differences might exist depending on the specific molding system.

Once a strain profile has been developed for a molding system, deviations from the target strain profile can be identified and used to take corrective action. Deviations may be determined for various process variables. For example, during steps 2 and 3, process variables that can be tracked to ensure proper filling include: (a) the strain value, which should peak at an expected amount when the clamp tonnage set-point has been reached, and (b) the time that it took to reach the clamp tonnage set-point. These process variables can be compared to reference values used to make the strain profile. An upper and lower acceptable deviation limit may be set for each reference value and may be adjusted if desirable. The ability to set or adjust a reference value or the upper and lower acceptable deviation limit may be limited to system administrators. Because temperature impacts strain, temperature data provided from a location near the strain sensor should always be taken into consideration when calculating deviations from a target strain profile.

If a process variable deviates beyond the acceptable deviation limit in either direction, an alarm may be triggered. After the alarm is triggered, the system may continue to run while providing a visual and/or audible alarm to alert relevant people of the issue. Alternately, triggering of the alarm may result in automatically stopping the fill cycle. As yet another alternative, triggering of the alarm may first result in a visual and/or audible alarm, and the system may only be automatically shut down if the alarm is generated multiple times within a set period of time. The number of times the alarm must be triggered and the time period in which the repeated triggering must occur can be set by an administrator. The type of alarm and the response of the system to the alarm may vary depending upon which filling step the molding system is at when the alarm is triggered.

When an alarm is triggered, a number of potential causes can be identified for each step of the filling process. For example, if the deviation occurs during steps 2 and 3, the possible causes would include that the mold has been installed improperly, that the clamping tonnage set-point has been changed, that the mold temperature has changed, that the molding apparatus is not level or has changed, or that the strain gauge has changed. For some of the possible causes, additional causes can be identified. For example, if the mold temperature has changed, something may have gone awry with the heat sources for the mold or the cooling water that cools the mold may be at the wrong temperature or flow rate. Likewise, if the strain gauge has changed, the problem may be with the calibration of the strain gauge or perhaps the strain gauge has sustained damage. Corrective action may then be taken to address the cause of the problem.

BRIEF DESCRIPTION OF THE DRAWINGS

While the specification concludes with claims particularly pointing out and distinctly claiming the subject matter that is regarded as the present disclosure, it is believed that the disclosure will be more fully understood from the following description taken in conjunction with the accompanying drawings. Some of the figures may have been simplified by the omission of selected elements for the purpose of more clearly showing other elements. Such omissions of elements in some figures are not necessarily indicative of the presence or absence of particular elements in any of the exemplary embodiments, except as may be explicitly delineated in the corresponding written description. None of the drawings are necessarily to scale.

DETAILED DESCRIPTION OF THE INVENTION

Figure 1:
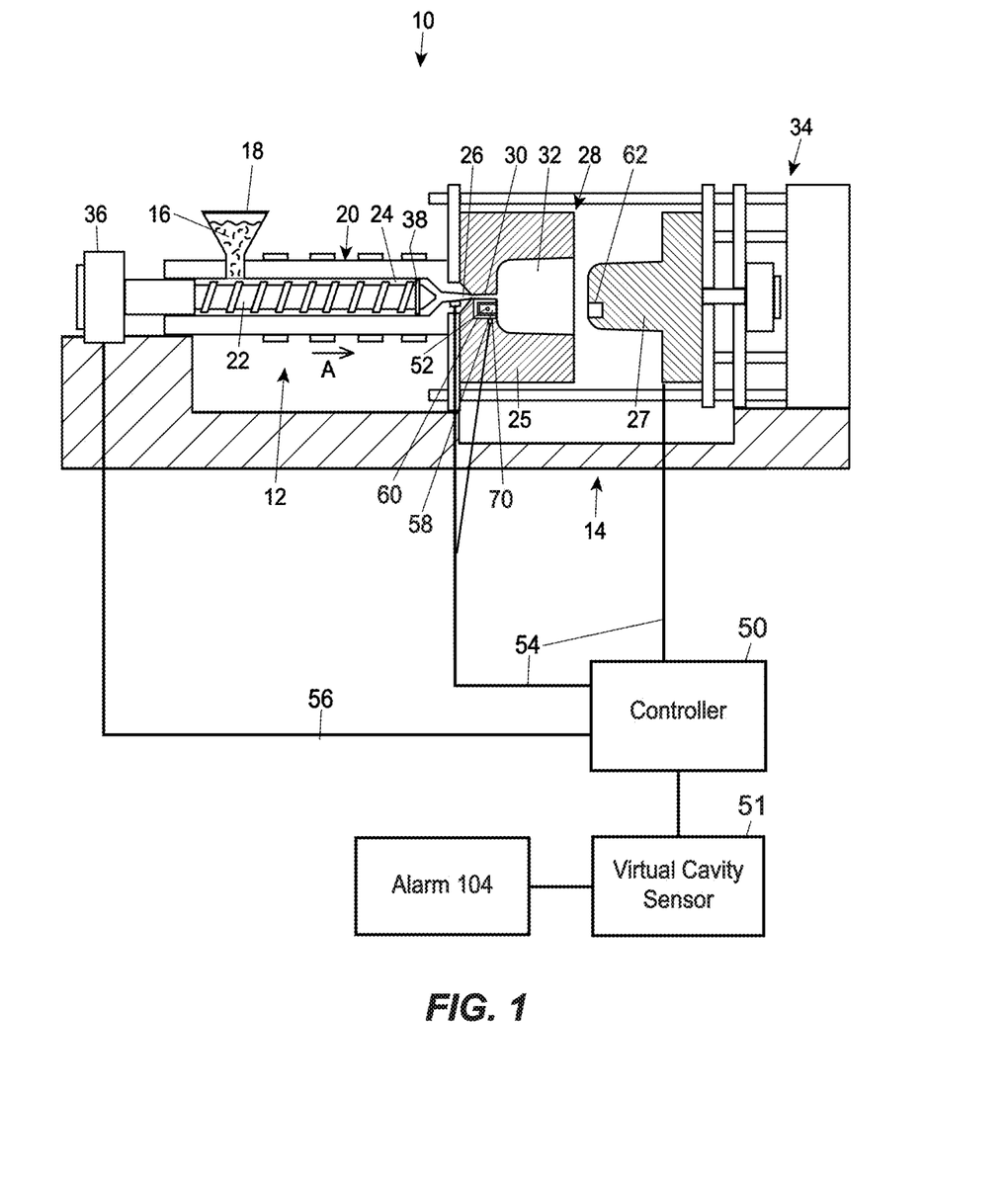
FIG. 1 illustrates, semi-schematically, a conventional injection molding apparatus, wherein a support bracket holds a coupon upon which a strain gauge sensor is placed adjacent to a first mold side in the vicinity of the nozzle to the mold cavity and a hammer is on a second mold side downstream of the nozzle and configured to contact the coupon when the mold is in a closed position.

Referring to the figures in detail, FIG. 1 illustrates an exemplary injection molding apparatus 10 for producing thermoplastic parts in high volumes (e.g., a class 101 injection mold, or an "ultra-high productivity mold", a class 102 (medium-to-high productivity mold), or class 103 (a medium productivity mold)). The injection molding apparatus 10 generally includes an injection system 12 and a clamping system 14. A thermoplastic material may be introduced to the injection system 12 in the form of thermoplastic pellets 16. The thermoplastic pellets 16 may be placed into a hopper 18, which feeds the thermoplastic pellets 16 into a heated barrel 20 of the injection system 12. The thermoplastic pellets 16, after being fed into the heated barrel 20, may be driven to the end of the heated barrel 20 by a ram, such as a reciprocating screw 22. The heating of the heated barrel 20 and the compression of the thermoplastic pellets 16 by the reciprocating screw 22 causes the thermoplastic pellets 16 to melt, forming a molten thermoplastic material 24. The molten thermoplastic material is typically processed at a temperature of about 130° C. to about 410° C.

The reciprocating screw 22 forces the molten thermoplastic material 24 toward a nozzle 26 to form a shot of thermoplastic material, which will be injected into a mold cavity 32 of a mold 28 via one or more gates. The molten thermoplastic material 24 may be injected through a gate 30, which directs the flow of the molten thermoplastic material 24 to the mold cavity 32. The mold cavity 32 is formed between first and second mold sides 25, 27 of the mold 28 and the first and second mold sides 25, 27 are held together under pressure by a press or clamping unit 34. The press or clamping unit 34 applies a clamping force during the molding process that is greater than the force exerted by the injection pressure acting to separate the two mold halves 25, 27, thereby holding the first and second mold sides 25, 27 together while the molten thermoplastic material 24 is injected into the mold cavity 32. In a typical high variable pressure injection molding machine, the press typically exerts 30,000 psi or more because the clamping force is directly related to injection pressure. To support these clamping forces, the clamping system 14 may include a mold frame and a mold base.

Once the shot of molten thermoplastic material 24 is injected into the mold cavity 32, the reciprocating screw 22 stops traveling forward. The molten thermoplastic material 24 takes the form of the mold cavity 32 and the molten thermoplastic material 24 cools inside the mold 28 until the thermoplastic material 24 solidifies. Once the thermoplastic material 24 has solidified, the press 34 releases the first and second mold sides 25, 27, the first and second mold sides 25, 27 are separated from one another, and the finished part may be ejected from the mold 28. The mold 28 may include a plurality of mold cavities 32 to increase overall production rates. The shapes of the cavities of the plurality of mold cavities may be identical, similar or different from each other. (The latter may be considered a family of mold cavities).

A controller 50 is communicatively connected with a strain gauge sensor 52, a screw control 36, and a temperature sensor 70. The strain gauge 52 may be located on a coupon 58, which is secured to the exterior surface of a first mold side 25 near the parting line between the first mold side 25 and the second mold side 27 and in the vicinity of the nozzle 26 by a bracket 60. In other embodiments within the scope of the present disclosure, the strain gauge 52 may be located directly on the mold 28 or in another location in the injection molding apparatus 10 altogether. The temperature sensor 70 is located near the strain gauge 52. The controller 50 may include a microprocessor (or another suitable processing unit, or several such units), a non-transitory memory, and one or more communication links.

Figure 1A:
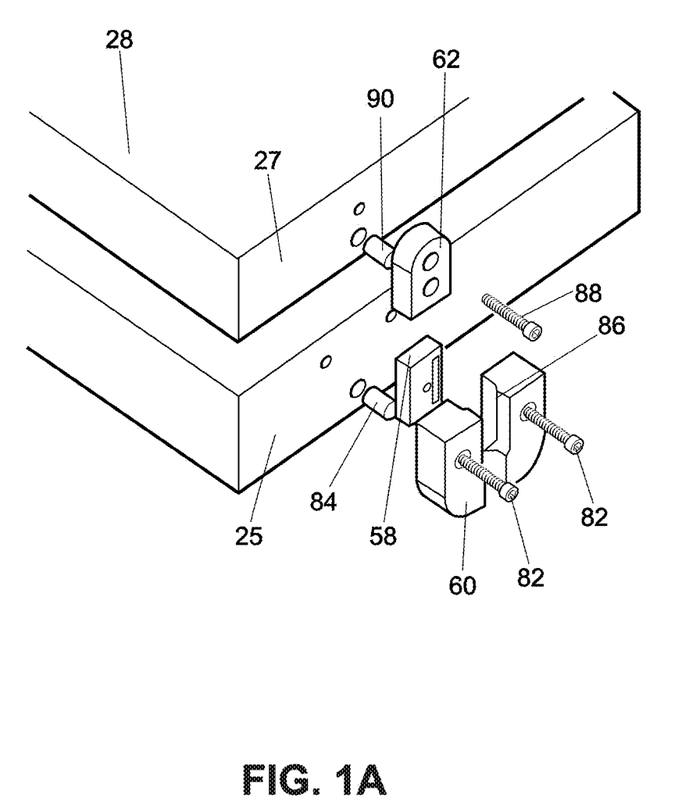
FIG. 1A illustrates an enlarged perspective view of the support bracket, coupon, and hammer depicted in FIG. 1.

In some embodiments, as shown in FIG. 1A, the first mold side 25 has holes drilled in it and the bracket 60 is secured to the first mold side 25 by bracket bolts 82 that are inserted through the bracket and into the first mold side 25 and by a bracket peg 84 which is inserted partially into the bracket 80 and partially into a hole in the first mold side 25. The bracket 60 has a bracket ledge 86 configured to secure the coupon 58 in a floating manner between the bracket 60 and an exterior side of the first mold side 25. The coupon 58 is not attached to the bracket 60 or the first mold side 25 because doing so might create strain within the coupon 58 that would interfere with the calculation of conditions within the mold cavity. One side of the coupon 58 is aligned with the parting line of the mold 28 along an edge of first mold side 25. The second mold side 27 has holes drilled into it, and a hammer 62 is secured to the second mold side 27 by a hammer bolt 88 that is inserted through the hammer 62 into the second mold side 27 and by a hammer peg 90 which is inserted partially into the hammer 62 and partially into a hole in the second mold side 27. A portion of the hammer 62 is aligned with the parting line of the mold 28 along an edge of second mold side 27 and is configured to contact the coupon 58 when the mold 28 is closed. In other embodiments, a pushing portion of the hammer 62 may be secured to the exterior surface of the mold side 27 while a lever portion of the hammer 62 may be secured elsewhere within the injection molding apparatus 10 or may be integral with the coupon 58, with the hammer configured such that the pushing portion pushes the lever portion when the mold 28 is closed.

The strain gauge sensor 52 senses surface strain of the coupon 58, and the temperature sensor 70 senses the temperature changes. Data from the strain gauge sensor 52 and the temperature sensor 70 may be communicated to a processor that calculates the change in the surface strain of the coupon 58. Electric signals 54 from the strain gauge sensor 52 and temperature sensor 70 may travel along one or more electrical paths, such as wires 54, depicted in FIG. 1 in solid lines, ranging in strength from −10 to 10 Volts. The controller 50 may be connected to the screw control 36 via wired connection 56. In other embodiments, the controller 50 may be connected to the screw control 36 via a wireless connection, a mechanical connection, a hydraulic connection, a pneumatic connection, or any other type of communication connection known to those having ordinary skill in the art that will allow the controller 50 to communicate with the screw control 36.

Additionally, the controller 50 is in communication with a virtual cavity sensor 51, which is implemented as a program, or a set of software instructions. In this disclosure, the term "virtual cavity sensor" can refer to a module that determines the value of a process variable, such as pressure, without directly measuring this process variable. The strain gauge sensor 52, the temperature sensor 70, and the virtual cavity sensor 51 together form a pressure controlling system that generates data relevant to strategic controlling of the pressure within the mold cavity 32. As used herein, the term "pressure controlling system" refers to any suitable group of components, which can include both software-implemented and hardware-implemented components, that generate a signal indicative of a condition within a mold cavity based on a signal indicative of another process variable.

For example, if based on the coupon surface strain information provided by the strain gauge sensor 52 and temperature sensor 70, a processor associated with the controller 50 determines that pressure within the mold cavity exceeds a trigger point (or is outside of a predetermined acceptable range), the virtual cavity sensor 51 signals the controller to adjust the screw control 36 to bring the pressure within the mold cavity back to a level below the trigger point (or within the predetermined acceptable range). As another example, if based on the coupon surface strain information provided by the strain gauge sensor 52 and temperature information provided by temperature sensor 70, a processor associated with the controller 50 determines that the melt flow front has progressed beyond a trigger point (which may correlate to a percentage of the mold that has been filled), the virtual cavity sensor 51 signals the controller 50 to adjust the screw control 36 to bring the pressure within the mold cavity to a predetermined acceptable finalizing pressure or range, which may involve a reduction in pressure to avoid overpacking a mold cavity, and thereby prevent unwanted flashing.

Figure 2:
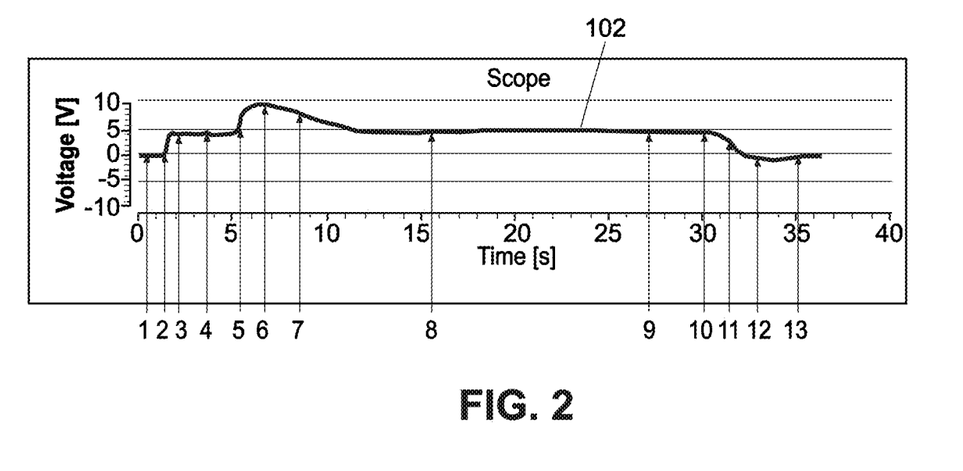
FIG. 2 illustrates an exemplary target strain profile for the injection molding system depicted in FIG. 1.

The virtual cavity sensor 51, in short, strives to achieve a target strain profile 102 in the injection molding apparatus 10 over time. FIG. 2 illustrates an exemplary target strain profile 102 for the injection molding system depicted in FIG. 1. In some instances, the virtual cavity sensor 51 in conjunction with the controller is able to achieve the target strain profile 102 on its own. In some instances, problems may arise that cannot be corrected by the virtual cavity sensor 51 in conjunction with the controller 50, as discussed with respect to FIGS. 12-14 below. In such an instance, the virtual cavity sensor 51 activates an alarm 104. The alarm 104 may be a visual alarm, such as a flashing light or a pop-up window on a computer screen, or may be an audible alert such as a beeping sound or siren, or may be both visual and audible. The alarm 104 may be activated when the sensed strain deviates beyond an acceptable deviation limit from the target strain profile 102. The injection molding apparatus 10 may continue to run after the alarm 104 is triggered, may immediately shut down, or may continue to run for a period of time and then be automatically shut down if the alarm 104 is not turned off within a set period of time or the alarm 104 is triggered multiple times within a set period of time. An administrator can set the functioning of the alarm 104. The type of alarm (visual and/or audible, for example) may vary depending upon what stage of the injection molding process the injection molding apparatus 10 is undergoing when the alarm 104 is triggered.

Figure 3:
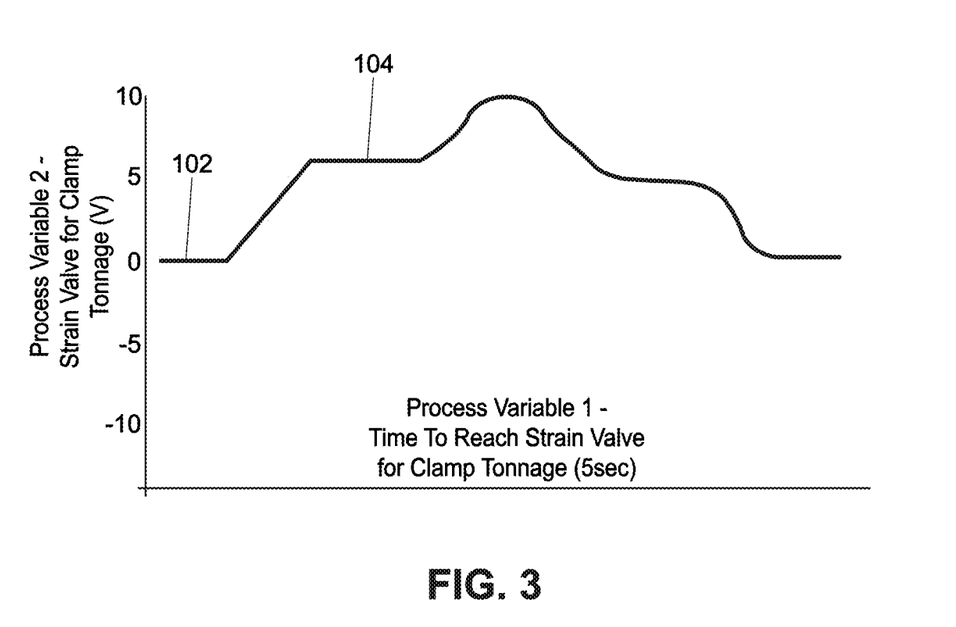
FIG. 3 is an enlarged partial exemplary target strain profile of the exemplary strain profile illustrated in FIG. 2 during the beginning of the injection molding cycle.
Figure 4:
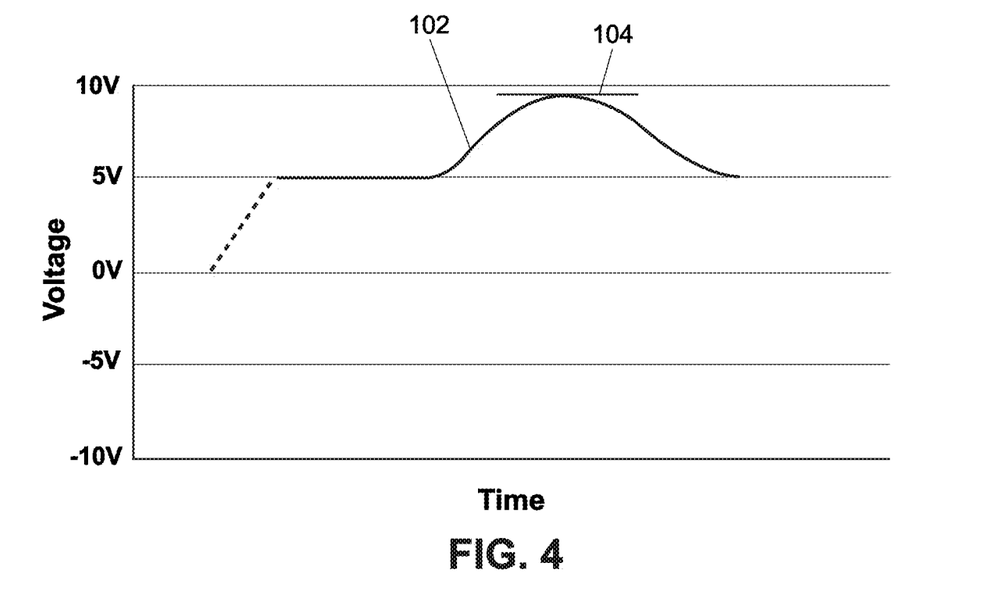
FIG. 4 is an enlarged partial exemplary target strain profile of the exemplary strain profile illustrated in FIG. 2 in the middle of the injection molding cycle.
Figure 5:
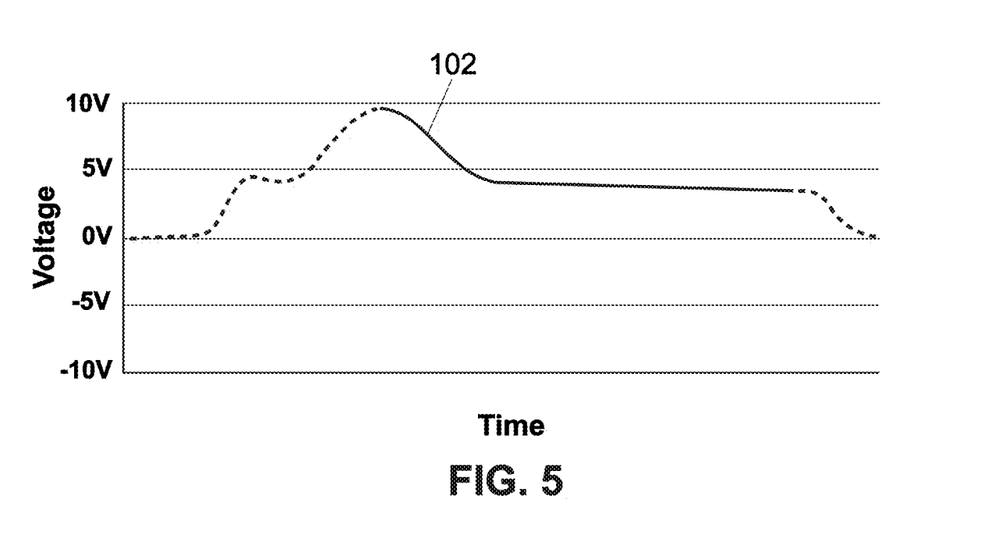
FIG. 5 is an enlarged partial target exemplary strain profile of the exemplary strain profile illustrated in FIG. 2 at the end of the injection molding cycle.

FIG. 2 provides the entire target strain profile 102 for the conventional injection molding apparatus 10 depicted in FIG. 1. A similar target strain profile 102 would be expected. At the start of the cycle (step 1), the mold 28 is open and experiences no strain. Then the mold sides 25 and 27 close, the clamping tonnage begins to build, and the mold 28 experiences a change in strain (step 2). When the clamp tonnage set-point for securing the mold sides 25 and 27 together is reached, the change in strain in the mold 28 becomes zero (step 3). The mold 28 experiences a moderate change in strain as molten thermoplastic material 24 begins to enter and fill the mold 28 (step 4), and then experiences a significant change in strain as the end of the fill approaches and molten thermoplastic material 28 is more tightly packed into the mold 28 (step 5). At the end of the fill, the increase in pressure resulting from the final filling of the mold cavity 32 is balanced by the reduction in pressure resulting from the previously injected thermoplastic material 28 beginning to cool and shrink (step 6) so little to no change in strain is experienced. After the fill is completed, the thermoplastic material 28 forming the part is allowed to cool and shrink (step 7), causing a change in strain in the mold 28. The strain in the mold 28 is then held constant until the thermoplastic material 28 in the gate of the mold 28 freezes (steps 8-10). The mold 28 is then unclamped, resulting in a change in strain (step 11). When the mold 28 is opened to release the newly formed part, the mold 28 will no longer experience a change in strain (step 12). The injection molding cycle is then over (step 13). FIGS. 3-5 provide enlarged portions of exemplary strain profile 102. The maximum target strain value 104 of the target strain profile 102 is marked in FIG. 3. A target strain profile comparable to target strain profile 102 would be expected for a substantially constant pressure injection molding process.

Figure 6:
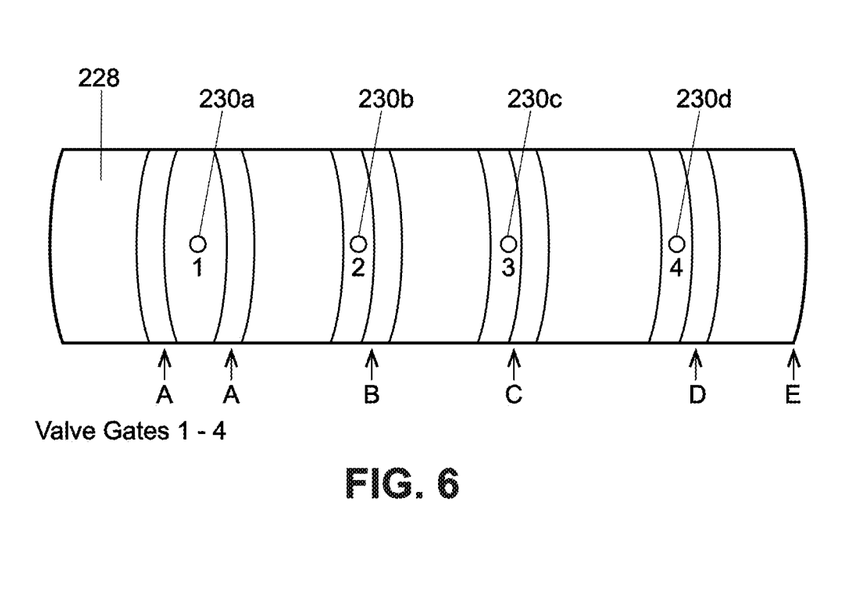
FIG. 6 is an overhead view of sequential valve gate injection molding system.
Figure 7:
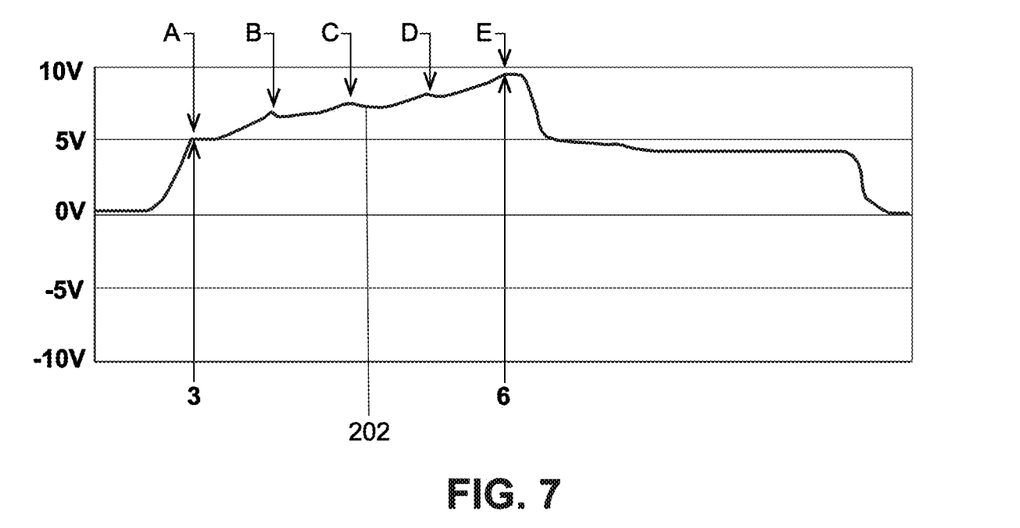
FIG. 7 is an exemplary target strain profile for filling the sequential valve gate injection molding system depicted in FIG. 6.

FIG. 6 illustrates a top view of a mold 228 of a sequential valve gate injection molding apparatus 200. The mold 228 has four gates, 230*a*, 230*b*, 230*c*, and 230*d* that allow thermoplastic material to be injected into the mold cavity 232 of the mold 228. Gate 230*a* is opened first, with the remainder of the gates 230*b*, 230*c*, and 230*d* opened in order as the melt flow front reaches their respective positions. FIG. 7 provides a target strain profile 202 for the sequential valve gate injection molding apparatus 200 between step 3 and step 6 of the method discussed above. Unlike the target strain profile 102 for a conventional injection molding apparatus 10, in which the change in strain was relatively flat between steps 3 and 5 and then jumped sharply to the maximum target strain value 104 between steps 5 and 6, the target strain profile 202 shows that the sequential valve gate injections molding apparatus 200 will experience an gradual increase in a change in strain with the opening of each of the four gates 230*a*, 230*b*, 230*c*, and 230*d* prior to reaching the maximum target strain value 204. The opening of each gate 230*a*, 230*b*, 230*c*, and 230*d* corresponds with points A, B, C, and D respectively on the target strain profile 202.

Figure 8:
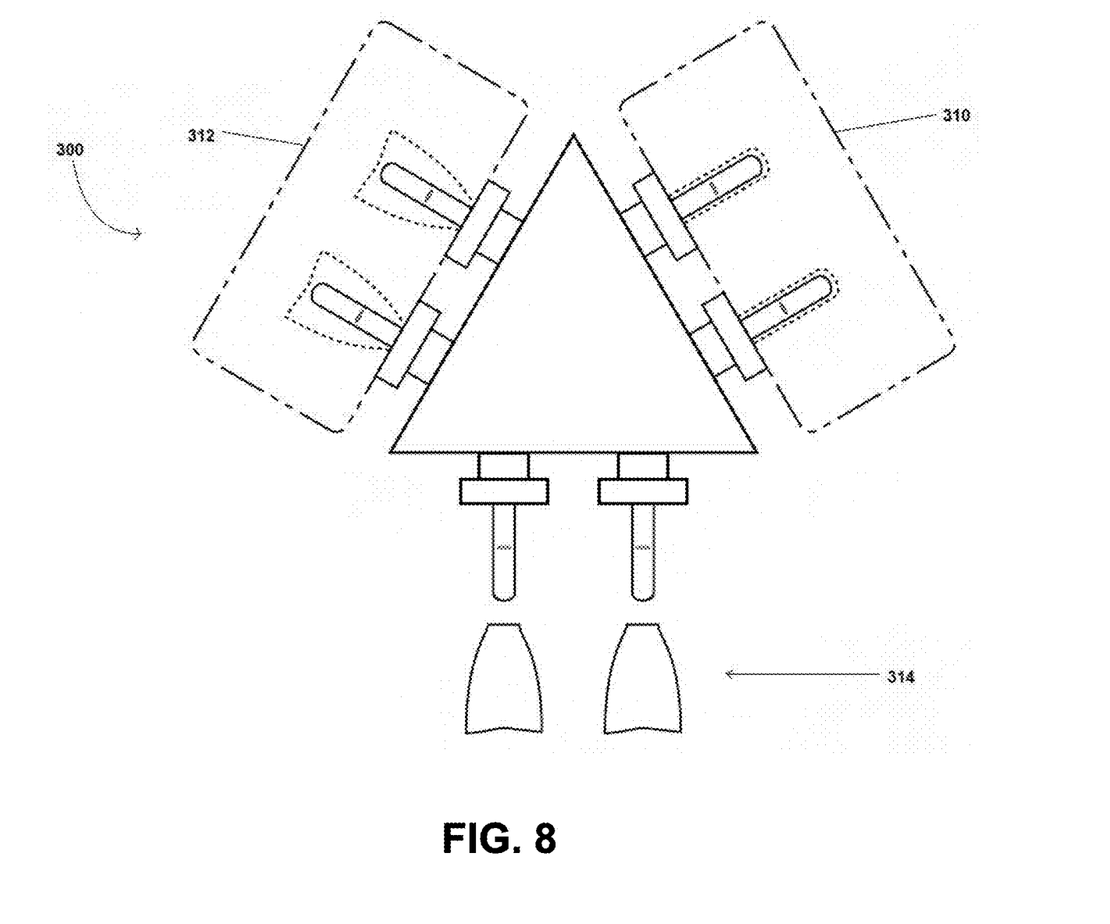
FIG. 8 is an overhead view of an injection-blow molding system.
Figure 9:
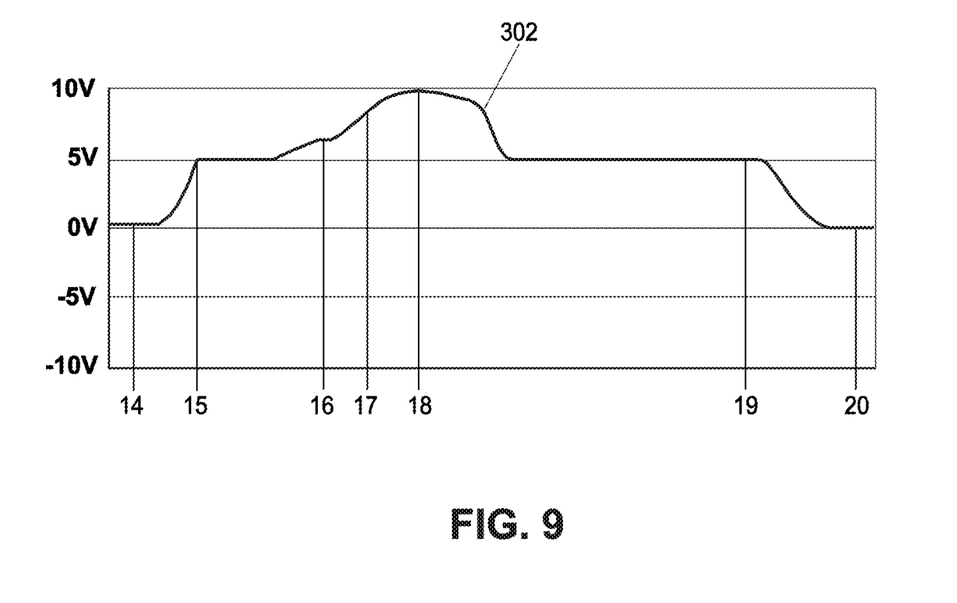
FIG. 9 is an exemplary target strain profile for filling the injection-blow molding system depicted in FIG. 7.

FIG. 8 depicts a combination blow molding/injection molding apparatus, also referred to herein as a blow-injection molding apparatus 300. The blow-injection molding apparatus has three stations: The first station is the injection molding station 310, where conventional injection molding occurs as discussed above. For instance, a parison is injection molded at the first station. The second station is the blow molding station 312, where the injection molded parts, such as parisons, undergo blow molding. The third station is the ejection station 314, where the completed parts are ejected. During the injection molding process at the injection molding station 310, the target strain profile will generally resemble target strain profile 102. FIG. 9 provides a target strain profile 302 for the blow molding portion of the blow-injection molding process. At step 14, the blow mold 316 is closed. The change in strain between steps 15 and 18 occurs as the core rod is opened and air is injected into the part. The change in strain between steps 18 and 20 occurs as the plastic cools and the mold opens.

Figure 10:
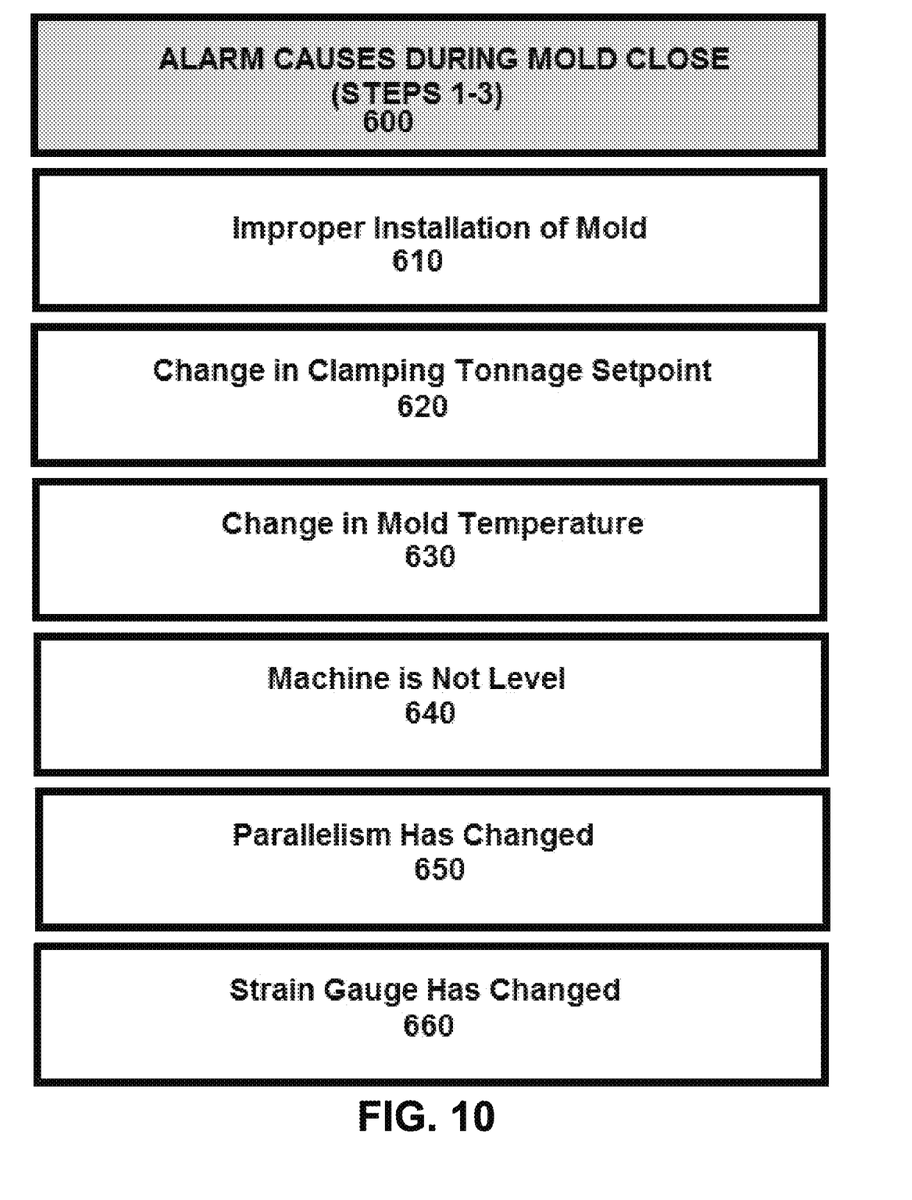
FIG. 10 is a chart of potential causes for a strain sensor triggered alarm at steps 1-3 in a conventional injection molding system.

FIG. 10 provides a list 600 of possible alarm-triggering events that may occur during the initial mold closing (steps 1-3) of a conventional injection molding process. The item or items on the list 600 that triggered or may have triggered the alarm may optionally be displayed when the alarm sounds and/or illuminates. Box 610 identifies improper installation of a mold as an alarm cause. Box 620 identifies a change in a clamping tonnage set-point as an alarm cause. Box 630 identifies a change in mold temperature as an alarm cause. A change in alarm temperature could occur due to problems with a mold heater, improper cooling water temperatures, or improper water flow rate, among other reasons. Box 640 identifies the machine not being level as an alarm cause. Box 650 identifies the parallelism has changed as an alarm cause, that is, whether the two platens to which each mold half is affixed are parallel or not. Box 660 identifies a change in the strain gauge, such as a calibration issue or damage to the strain gauge, as an alarm cause.

Figure 11:
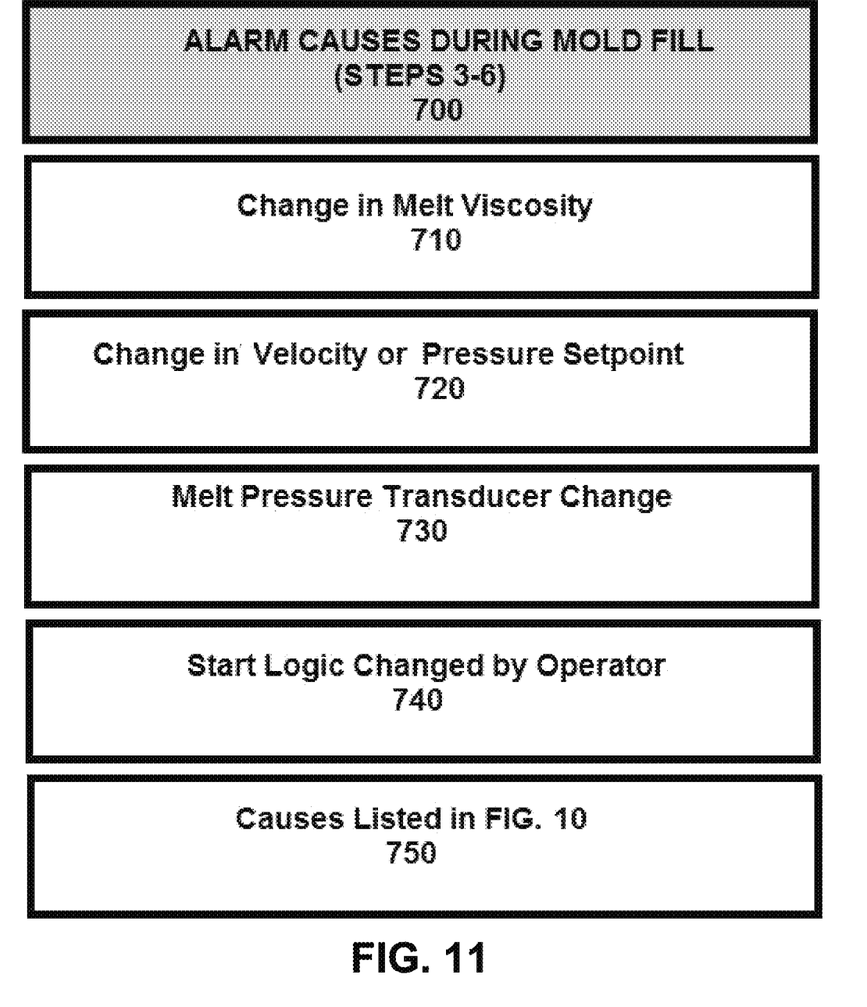
FIG. 11 is a chart of potential causes for a strain sensor triggered alarm at steps 3-6 in a conventional injection molding system.
Figure 12:
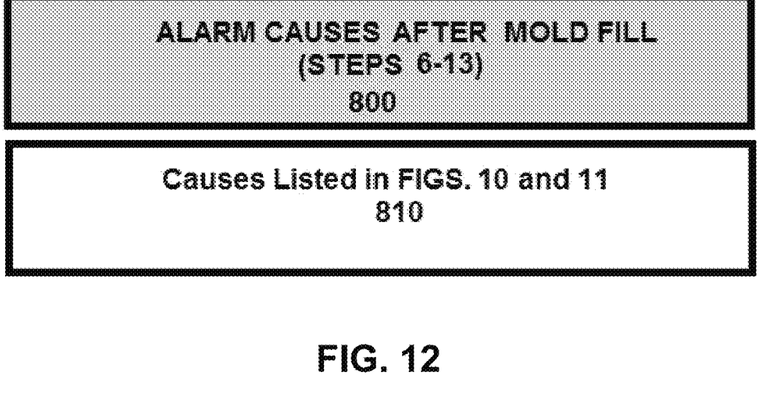
FIG. 12 is a chart of potential causes for a strain sensor triggered alarm at steps 6-13 in a conventional injection molding system.

FIG. 11 provides a list 700 of possible alarm-triggering events during the mold fill (steps 3-6) of a conventional injection molding system. Box 710 identifies a change in the melt viscosity of a raw material, such as a change in the melt flow index (MFI), as an alarm cause. Box 720 identifies a change in velocity and/or pressure set point by the operator as an alarm cause. Box 730 identifies a melt pressure transducer change as an alarm cause. The melt pressure transducer may cause an alarm if, for example, it has been improperly calibrated or damaged. Box 740 identifies mold fill start logic being changed by an operator as an alarm cause. Box 750 identifies the previous alarm causes, discussed with respect to list 600, as potential alarm causes during this stage of the injection molding process as well. FIG. 12 provides a list 800 for possible alarm causes after the mold fill (steps 6-13) of a conventional injection molding system. Box 810 identifies the previous alarm causes, discussed with respect to lists 600 and 700, as potential alarm causes during this stage of the injection molding process. The lists 600, 700, and 800 are merely exemplary and are not intended to be comprehensive. Other alarm causes may exist in conventional injection molding processes and in other molding processes discussed in this application.

Figure 13:
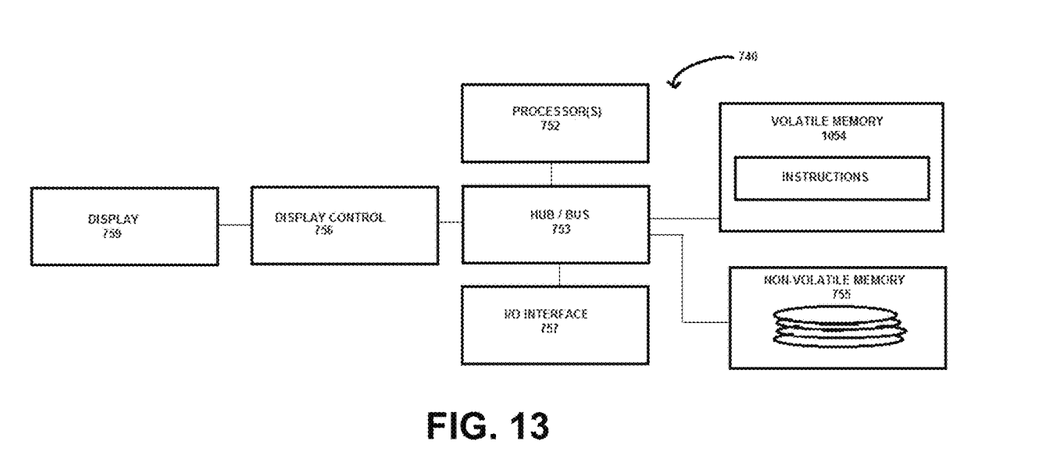
FIG. 13 is a block diagram of an example virtual cavity sensor that may be utilized in a molding system.

FIG. 13 illustrates a block diagram of an example virtual cavity sensor 740 (such as virtual cavity sensor 51) that may be utilized in a molding system. The virtual cavity sensor 740 may include, for example, one more central processing units (CPUs) or processors 752, and one or more busses or hubs 753 that connect the processor(s) 752 to other elements of the virtual cavity sensor 740, such as a volatile memory 754, a non-volatile memory 755, a display controller 756, and an I/O interface 1057. The volatile memory 754 and the non-volatile memory 755 may each include one or more non-transitory, tangible computer readable storage media such as random access memory (RAM), read only memory (ROM), FLASH memory, a biological memory, a hard disk drive, a digital versatile disk (DVD) disk drive, etc.

In an embodiment, the memory 754 and/or the memory 755 may store instructions 758 that are executable by the processor 752. For example, in a molding apparatus particularly configured to perform the techniques described herein, the instructions may be the instructions executed by the virtual cavity sensor 140. In some embodiments, the virtual cavity sensor 740 may also perform any number of actions described herein with respect to a controller, such as the controller 50. In these embodiments, the instructions stored in the memories 1054 and 1055 may also include instructions to perform the actions described with respect to the controller. Accordingly, any reference to a controller being a distinct entity from a virtual cavity sensor is done for ease of explanation, and does not require the implementation of two distinct hardware modules.

The illustrated virtual cavity sensor 740 is only one example of a virtual cavity sensor suitable to be particularly configured for use in a molding apparatus. Other embodiments of the virtual cavity sensor 740 may also be particularly configured for use in a molding apparatus, even if the other embodiments have additional, fewer, or alternative components than shown in FIG. 13, have one or more combined components, or have a different configuration or arrangement of the components. Moreover, the various components shown in FIG. 13 can be implemented in hardware, a processor executing software instructions, or a combination of both hardware and a processor executing software instructions, including one or more signal processing and/or application specific integrated circuits.

Figure 14:
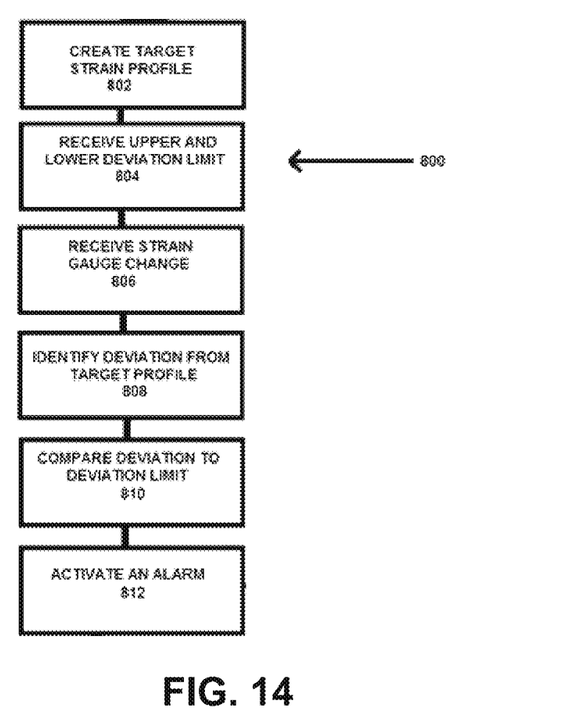
FIG. 14 is a flow diagram of an example method of monitoring and controlling a molding apparatus.

FIG. 13 illustrates a block diagram of a method 800 of monitoring and controlling a molding apparatus, or alternately processor-executable instructions, that, when executed, cause one or more processors to perform the actions listed. Box 802 illustrates creating by one or more processors a target strain profile for a molding process of a molding apparatus. Box 804 offers receiving via an interface an upper deviation limit and a lower deviation limit for the molding process. Box 806 illustrates receiving as an output from a strain gauge a change in strain in the molding apparatus. Box 808 illustrates identifying with the one or more processors a deviation from the target strain profile based on the sensed change in strain. Box 810 illustrates comparing by the one or more processors the deviation to the upper deviation limit or the lower deviation limit. Box 812 illustrates, when the deviation exceeds the upper deviation limit or the lower deviation limit, activating an alarm by the one or more processors.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A method of monitoring and controlling a molding apparatus comprising:
    creating, by one or more processors, a target strain profile for a molding process of a molding apparatus;
    receiving, via an interface, an upper deviation limit and a lower deviation limit for the molding process;
    receiving, as an output from a strain gauge, a change in strain in the molding apparatus;
    identifying, by the one or more processors, a deviation from the target strain profile based on the change in strain received from the strain gauge;
    comparing, by the one or more processors, the deviation to the upper deviation limit or the lower deviation limit; and
    when the deviation exceeds the upper deviation limit or the lower deviation limit, activating, by the one or more processors, an alarm.

2. The method of claim 1, wherein in creating the target strain profile for a molding process, the molding process is at least one of a group consisting of injection molding, substantially constant pressure injection molding, sequential valve gate injection molding, injection-blow molding, metal injection molding, reaction injection molding, liquid injection molding, structural foam molding, liquid crystal polymer molding, and stretch blow molding.

3. The method of claim 1, wherein activating the alarm includes at least one of activating a visual alarm and activating an audible alarm.

4. The method of claim 1, further comprising:
    when the alarm is activated, sending an instruction to a controller to cause the molding process to immediately stop.

5. The method of claim 1, further comprising:
    receiving, via an interface, a maximum number of times the alarm can be activated within a period of time before the molding process is stopped; and
    sending an instruction to a controller to cause the molding process to stop when the number of times the alarm is activated exceeds the maximum number.

6. The method of claim 1, further comprising:
    when the alarm is activated, identifying, by the one or more processors, a step of the molding process that was occurring when the alarm was activated and identifying one or more potential causes of the alarm based on the step of the molding process that was occurring when the alarm was activated.

7. The method of claim 6, further comprising:
    receiving, via an interface, a set period of time for an operator to take corrective action to fix a cause of the alarm.

8. The method of claim 7, further comprising:
    when the corrective action is not taken within the set period of time, sending an instruction to the controller to stop the molding process.

9. The method of claim 6, and:
    determining, by the one or more processors, whether to activate a visual alarm based on the step of the molding process that was occurring when the alarm was activated.

10. The method of claim 6, further comprising:
    displaying the potential causes of the alarm on the interface.

11. The method of claim 1, further comprising:
    receiving, as an output from a temperature sensor, a temperature of the molding apparatus at the same time as receiving, as output from the strain gauge, the change in strain in the molding apparatus;
    wherein identifying, by the one or more processors, the deviation from the target strain profile based on the change in strain received from the strain gauge includes considering, by the one or more processors, the temperature received as the output from the temperature sensor.

12. The method of claim 1, and:
    receiving, via an interface, an adjustment to the upper deviation limit or the lower deviation limit.

13. The method of claim 1, wherein creating the target strain profile for the molding process of the molding apparatus includes identifying, by the one or more processors, steps undergone by the molding process.

14. The method of claim 13, wherein at least one of the steps identified by the one or more processors is at least one of: closing of a mold, applying clamping tonnage to the mold, achievement of a clamp tonnage set point, start of injection of material, velocity of injection of material, pressure of injection of material, time of injection of material, time of cooling of material in the mold, unclamping of the mold, and opening of the mold.

15. A non-transitory computer-readable storage medium storing processor-executable instructions, that, when executed, cause one or more processors to:
    create by one or more processors a target strain profile for a molding process of a molding apparatus;
    receive via an interface an upper deviation limit and a lower deviation limit for the molding process;
    receive as an output from a strain gauge a change in strain in the molding apparatus;

identify with the one or more processors a deviation from the target strain profile based on the change in strain received from the strain gauge;

compare by the one or more processors the deviation to the upper deviation limit or the lower deviation limit; and when the deviation exceeds the upper deviation limit or the lower deviation limit, activate an alarm by the one or more processors.

16. The non-transitory computer-readable storage medium of claim 15, wherein in the processor-executable instructions that when executed, cause the one or more processors to create by one or more processors a target strain profile for a molding process, the molding process is at least one of a group consisting of injection molding, substantially constant pressure injection molding, sequential valve gate injection molding, injection-blow molding, metal injection molding, reaction injection molding, liquid injection molding, structural foam molding, liquid crystal polymer molding, and stretch blow molding.

17. The non-transitory computer-readable storage medium of claim 15, wherein the processor-executable instructions that, when executed, cause the one or more processors to activate the alarm by the one or more processors include at least one of:

cause the one or more processors to activate a visual alarm, and cause the one or more processors to activate an audible alarm.

18. The non-transitory computer-readable storage medium of claim 15, wherein the processor-executable instructions, when executed, cause the one or more processors to:

when the alarm is activated, send an instruction to a controller to cause the molding process to immediately stop.

19. The non-transitory computer-readable storage medium of claim 15, wherein the processor-executable instructions, when executed, cause the one or more processors to:

receive via an interface a maximum number of times the alarm can be activated within a period of time before the molding process is stopped; and send an instruction to a controller to cause the molding process to stop when the number of times the alarm is activated exceeds the maximum number.

20. The non-transitory computer-readable storage medium of claim 15, wherein the processor-executable instructions, when executed, cause the one or more processors to:

when an alarm is activated, identify by the one or more processors a step of the molding process that was occurring when the alarm was activated and identify one or more potential causes of the alarm based on the step of the molding process that was occurring when the alarm was activated.

21. The non-transitory computer-readable storage medium of claim 20, wherein the processor-executable instructions, when executed, cause the one or more processors to:

receive via an interface a set period of time for an operator to take corrective action to fix a cause of the alarm.

22. The non-transitory computer-readable storage medium of claim 21, wherein the processor-executable instructions, when executed, cause the one or more processors to:

when the corrective action is not taken within the set period of time, send an instruction to the controller to stop the molding process.

23. The non-transitory computer-readable storage medium of claim 20, wherein the processor-executable instructions, when executed, cause the one or more processors to:

determine by the one or more processors whether to activate a visual alarm based on the step of the molding process that was occurring when the alarm was activated.

24. The non-transitory computer-readable storage medium of claim 20, wherein the processor-executable instructions, when executed, cause the one or more processors to:

display the potential causes of the alarm on the interface.

25. The non-transitory computer-readable storage medium of claim 15, wherein the processor-executable instructions, when executed, cause the one or more processors to:

receive as an output from a temperature sensor a temperature of the molding apparatus at the same time as receiving as output from the strain gauge the change in strain in the molding apparatus;

wherein the processor-executable instructions that, when executed, cause the one or more processors to identify with the one or more processors the deviation from the target strain profile based on the change in strain received from the strain gauge include considering with the one or more processors the temperature received as the output from the temperature sensor.

26. The non-transitory computer-readable storage medium of claim 15, wherein the processor-executable instructions, when executed, cause the one or more processors to:

receive via an interface an adjustment to the upper deviation limit or the lower deviation limit.

27. The non-transitory computer-readable storage medium of claim 15, wherein the processor-executable instructions that, when executed, cause the one or more processors to create by the one or more processors a target strain profile for a molding process of a molding apparatus include processor-executable instructions that, when executed, cause the one or more processors to identify steps undergone by the molding process.

28. The non-transitory computer-readable storage medium of claim 27, wherein in the processor-executable instructions that, when executed, cause the one or more processors to identify steps undergone by the molding process, at least one of the steps identified by the one or more processors is at least one of: closing of a mold, applying clamping tonnage to the mold, achievement of a clamp tonnage set point, start of injection of material, velocity of injection of material, pressure of injection of material, time of injection of material, time of cooling of material in the mold, unclamping of the mold, and opening of the mold.

* * * * *